United States Patent [19]

Kazama et al.

[11] Patent Number: 5,508,908
[45] Date of Patent: Apr. 16, 1996

[54] MOTOR CONTROL UNIT WITH THERMAL STRUCTURE

[75] Inventors: Tsutomu Kazama; Satoshi Kondo, both of Aichi, Japan

[73] Assignee: Mitsubishi Denki Kabushiki Kaisha, Tokyo, Japan

[21] Appl. No.: 437,380

[22] Filed: May 9, 1995

Related U.S. Application Data

[63] Continuation of Ser. No. 229,131, Apr. 18, 1994, abandoned, which is a continuation of Ser. No. 921,213, Jul. 29, 1992, abandoned.

[30] Foreign Application Priority Data

Mar. 31, 1991 [JP] Japan ................... 3-191723

[51] Int. Cl.⁶ ........................................... H05K 7/20
[52] U.S. Cl. ..................... 363/141; 361/700; 361/715; 174/15.2; 165/80.3
[58] Field of Search .................... 165/80.3, 104.33; 174/15.2; 361/385, 386, 388, 389, 395; 363/37, 141

[56] References Cited

U.S. PATENT DOCUMENTS

| | | | |
|---|---|---|---|
| 4,327,399 | 4/1982 | Sasaki et al. | 361/385 |
| 4,399,486 | 8/1983 | Petsch | 363/141 |
| 4,503,483 | 3/1985 | Basiulis | 174/15.2 |
| 4,992,925 | 2/1991 | Meyer | 363/141 |

FOREIGN PATENT DOCUMENTS

| | | |
|---|---|---|
| 0298372 | 3/1989 | European Pat. Off. |
| 61-88289 | 6/1986 | Japan. |
| 6459895 | 3/1989 | Japan. |
| 2174564 | 7/1990 | Japan. |
| 326105 | 3/1991 | Japan. |

OTHER PUBLICATIONS

IBM Technical Disclosure Bulletin, vol. 18, No. 12, May 1976, pp. 3982–3983 "Heat–Pipe Cooled Stacked Electronic Wafer Package", Q. K. Kerjilian and R. N. Spaight.

*Primary Examiner*—Jeffrey L. Sterrett
*Attorney, Agent, or Firm*—Sughrue, Mion, Zinn, Macpeak & Seas; Richard C. Turner; Paul F. Neils.

[57] ABSTRACT

A motor control unit having a first semiconductor module circuit for converting an alternating current into a direct current, a second semiconductor module circuit consisting of switching elements for converting the direct current into an alternating current of optional voltage and frequency, and a control circuit for controlling the semiconductor module circuits. The unit has a case that is substantially rectangular in cross section, vertically high and laterally thin with respect to a perpendicular installation surface. Two heat sinks are disposed at the outside of the unit case at the back thereof and are thermally connected to a laminar heat plate that is disposed within the case and in contact with the heat dissipating installation surfaces of the semiconductor modules inside the unit case.

2 Claims, 7 Drawing Sheets

MOTOR CONTROL UNIT WITH THERMAL STRUCTURE

This is a continuation of application Ser. No. 08/229,131, filed Apr. 18, 1994 now abandoned, which is a continuation of application Ser. No. 07/921,213 filed Jul. 29, 1992, now abandoned.

BACKGROUND OF THE INVENTION

1. Field of the Invention

The present invention relates to a motor control unit, such as an inverter or a servo amplifier, comprising a main semiconductor circuit for controlling a motor and a control circuit for controlling the operation of the main semiconductor circuit.

2. Description of the Background Art

Motor control units are becoming smaller because power switching elements, such as power transistors, are made more compact and are used on highly integrated power printed circuit boards. However, compact and highly integrated boards in small control units pose a problem with the dissipation of heat generated by the power components and other elements in the unit. In addition, as motor control becomes higher in level, the circuits become more complicated. For example, a large number of motors are often employed and they are frequently controlled by a single central controller.

Figure 4A:
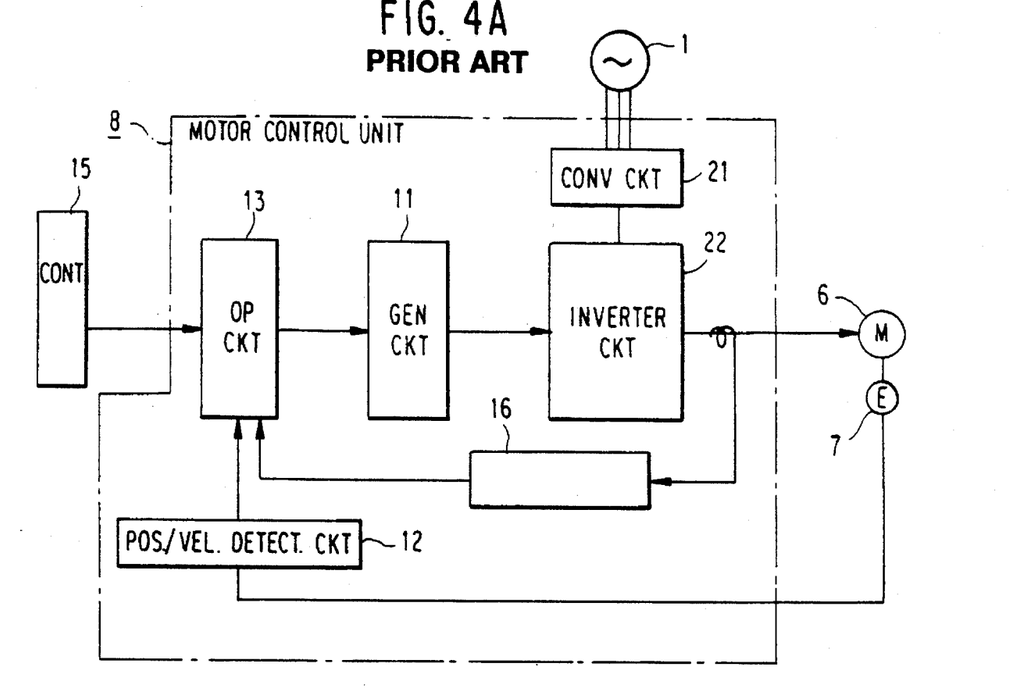
FIGS. 4A and 4B show a block diagram illustrating a general servo amplifier circuit arrangement and a main circuit diagram, respectively.
Figure 4B:
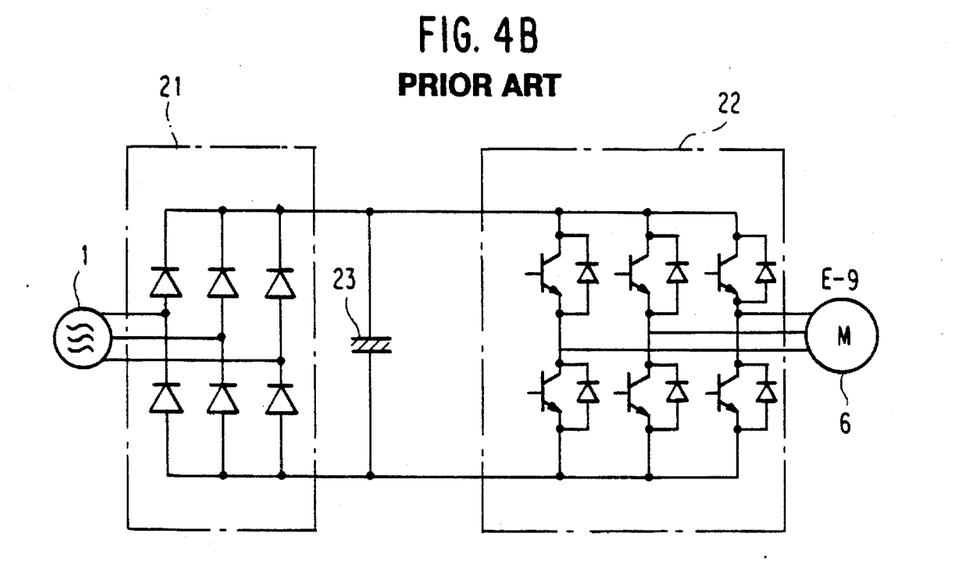

FIG. 4A is a block diagram showing the circuit arrangement of a servo amplifier known in the art and FIG. 4B a circuit diagram of its main circuit. In the Figures, there is a power supply 1 and a converter circuit 21 comprising a diode module for converting the alternating current of the power supply 1 of a commercial frequency into a direct current. A capacitor 23 is used for smoothing the direct current converted from the alternating current by the diodes 21. An inverter circuit 22, comprising switching elements such as a transistor module, is used for converting the direct current smoothed by the capacitor 23 into an alternating current of selectable voltage and frequency by means of a PWM generator circuit 11 and supplying it to a servo motor 6. An encoder 7 is for detecting the position and velocity of the servo motor 6 and transmitting a signal to a position/velocity detector circuit 12. An operation circuit 13 compares an external position command from a controller 15 with a signal from the position/velocity detector circuit 12 and transmits a voltage command to the PWM generator circuit 11 according to the result of this operation. Current detector 16 is operative to detect an output current from the inverter circuit 22 and transmit that signal to the operation circuit 13. In FIG. 4A, the combination of these elements comprises a "motor control unit" 8 (a servo amplifier in the case of servo control). The operation of the servo amplifier for the servo motor is omitted here since it is well known.

Figure 5:
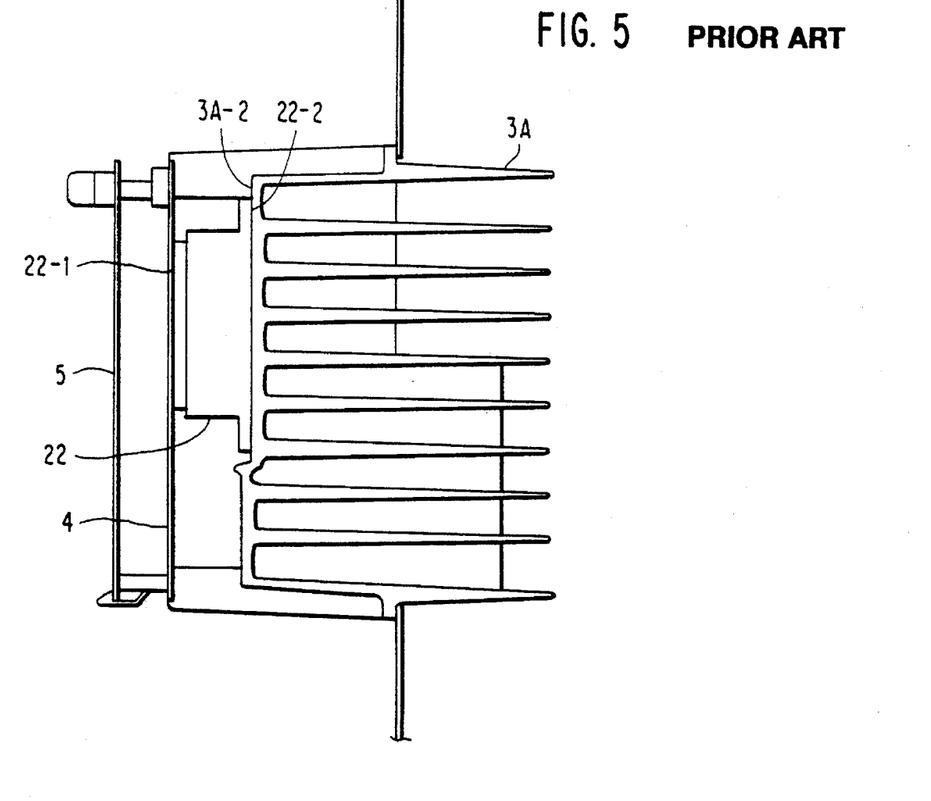
FIG. 5 is a top sectional view of a servo amplifier known in the art.
Figure 6:
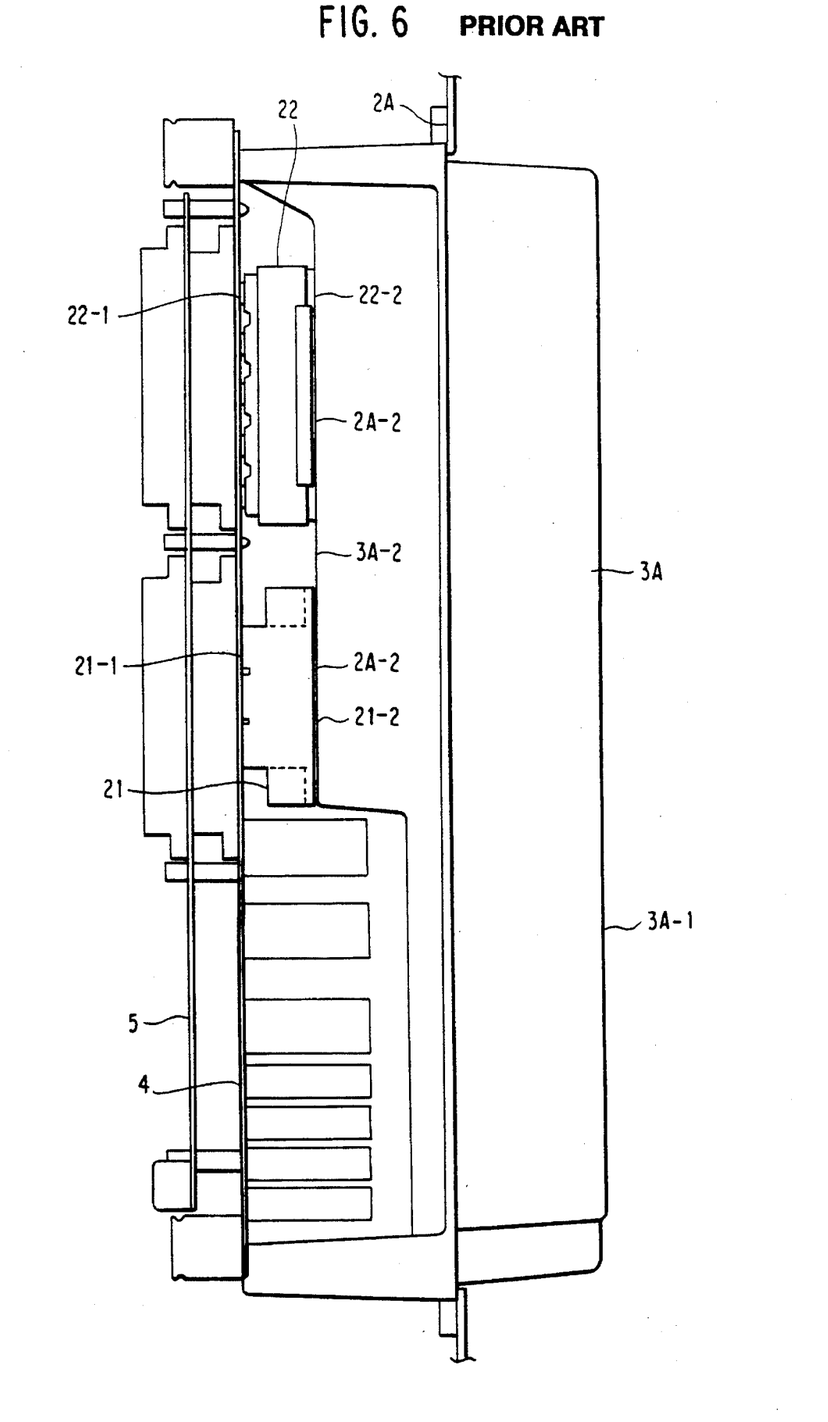
FIG. 6 is a side view showing the conventional servo amplifier in FIG. 5 from which a unit case and printed circuit boards have been removed.

An example of such motor control unit 8 is shown in a sectional view in FIG. 5 and a side view in FIG. 6. These two views show a motor control circuit from which a unit case and printed circuit boards have been removed. In these drawings, 2A indicates a unit case and 3A is a heat sink located at the back of the unit case 2A and has fins 3A-1 arranged outside the unit case 2A. The unit case 2A accommodates the components illustrated in FIGS. 4A and 4B including diode module 21, capacitor 23, transistor module 22, a main circuit printed circuit board 4 connected with the main circuit components, and a control circuit printed circuit board 5 comprising at least the operation circuit 13 and PWM generator circuit 11. The modules 21 and 22 have terminals 21-1 and 22-1 for electrical connection. The modules also have a contact section 2A-2 with heat radiating installation surfaces 21-2 and 22-2 for heat radiation from the front side and a heat sink section 2A-3 on the rear side. The terminals 21-1, 22-1 are connected to the printed circuit board 4 and the heat radiating installation surfaces 21-2, 22-2 are in contact with a connection surface 3A-2 of the heat sink 3A.

In this type of motor control unit 8, its unit case is generally contained in a control box and its heat sink is disposed outside the control box for enhanced heat dissipation.

Figure 7:
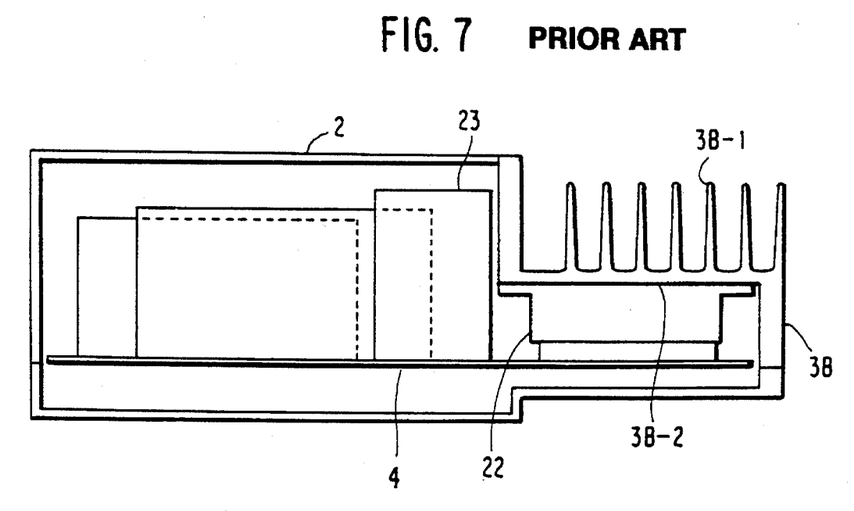
FIG. 7 is a top sectional view of another servo amplifier known in the art.

FIG. 7 shows another arrangement example of the motor control unit 8, wherein fins 3B-1 of a heat sink 3B are arranged in parallel with the front face of the motor control unit 8 and its connection 3B-2 is mounted with the main circuit parts which generate much heat.

Figure 8A:
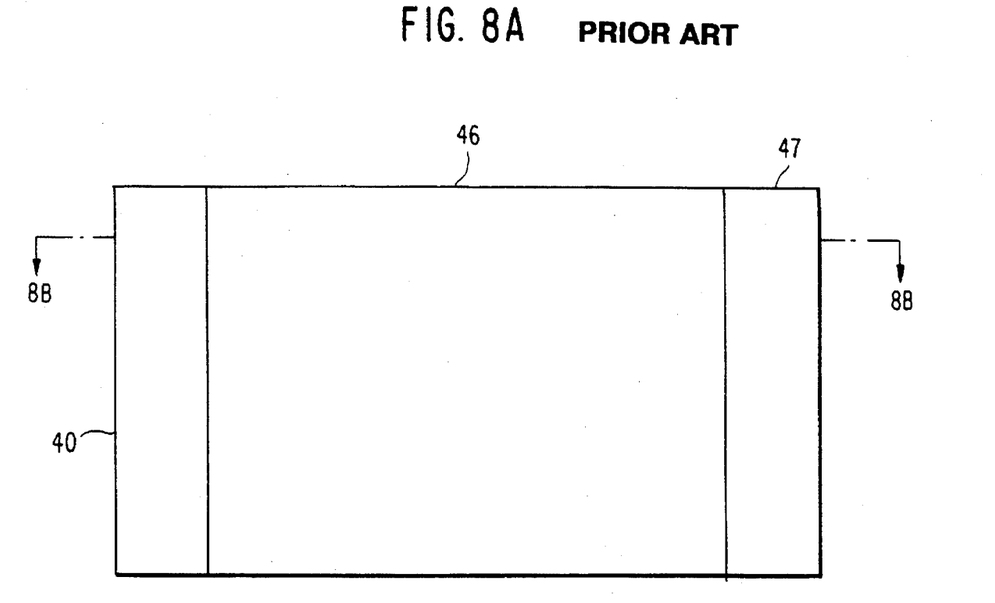
FIGS. 8A and 8B are side and top sectional views of an electronic component packaging device known in the art.
Figure 8B:
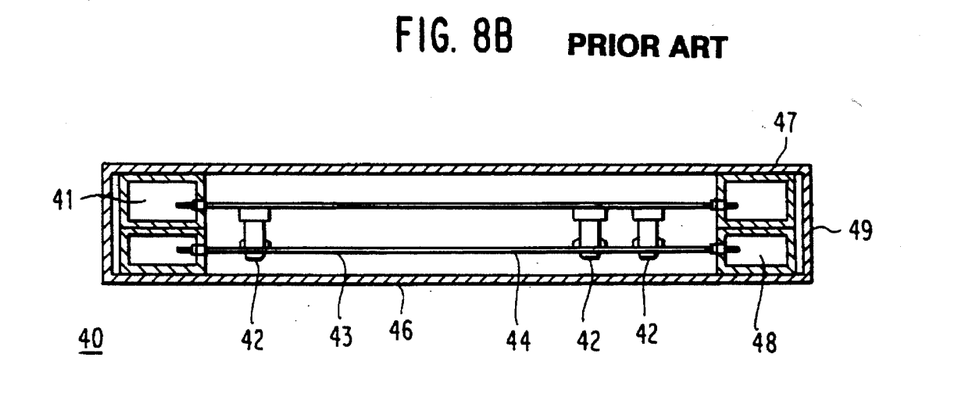

In Japanese Patent Disclosure No. 59895 of 1989, as shown in FIGS. 8A and 8B, an electronic component packaging module 40 is presented which transfers heat generated by electronic circuit packages 42 to a heat interface 47 located at the outside of an electronic circuit module 46 via a metal plate 44. A printed circuit board 43 is loaded with the electronic circuit packages 42, each incorporating a high-density electric circuit in a highly thermal conductive package case. The metal plate 44 connects to a heat pipe 48, which may otherwise be connected to or comprise an aluminum plate 49. At the other end of the packaging module 40 is an electronic interface 41 to which the printed circuit board components are electrically connected.

In the example shown in FIGS. 8A and 8B, the metal plate is in contact with the case of the electronic circuit packages, i.e. heat generator, and is heated thereby. Then, the plate conducts the heat to the heat pipe, and finally transfers it to the outside. This extended path of heat transfer results in low transfer efficiency.

Returning again to the conventional designs in FIGS. 5 and 6, the main circuit components, e.g. diode and transistor modules that generate much heat are generally rectangular and are provided with terminals for electrical connection on their wider-area side and with installation surfaces for heat dissipation on the other side. In the conventional design shown in FIG. 5 and FIG. 6, the wider-area side of the main circuit components is disposed in parallel with the front face of the motor control unit. This causes the width of the unit case (lateral direction in FIG. 6) to be restricted by the wider-area surface of the main circuit components, precluding design opportunities to make the unit case thinner. A wide installation area is therefore required when a plurality of motor control units are installed side by side, forming a string of control boxes.

Also, in the example shown in FIG. 7, the heat sink in this conventional design is rotated 90° and is required to support a number of main circuit components that generate a substantial amount of heat. However, this design requires the fin height of the heat sink to be reduced by the thickness of the main circuit components, thereby restricting the amount of heat generated by the main circuit components that can be removed effectively.

SUMMARY OF THE INVENTION

It is accordingly an object of the present invention to overcome the disadvantages in the background art by providing a laterally thin motor control unit having high heat radiating efficiency.

It is a further object of the present invention to achieve a motor control unit which has a small installation volume and occupies a small surface area when a plurality of motor control units are arranged side-by-side, but provides high heat dissipating efficiency.

The motor control unit according to the present invention includes a rectangular unit case that is vertically high and laterally thin with respect to a vertical installation surface and its volume extends perpendicular to that surface. The unit case contains printed circuit boards that have mounted thereon semiconductor modules and a laminar heat plate disposed in parallel with the right- and left-hand side walls of the unit case. One part of the heat plate is located inside the unit case and the other part thereof extends to the outside of the unit case. The heat dissipating installation surfaces of the semiconductor modules are in contact with the heat plate inside the unit case and a heat sink is in contact with the heat plate outside of the unit case.

The heat plate of the motor control unit according to the present invention transfers and dissipates heat generated in the unit case to the outside environment.

DESCRIPTION OF THE PREFERRED EMBODIMENTS

Figure 1:
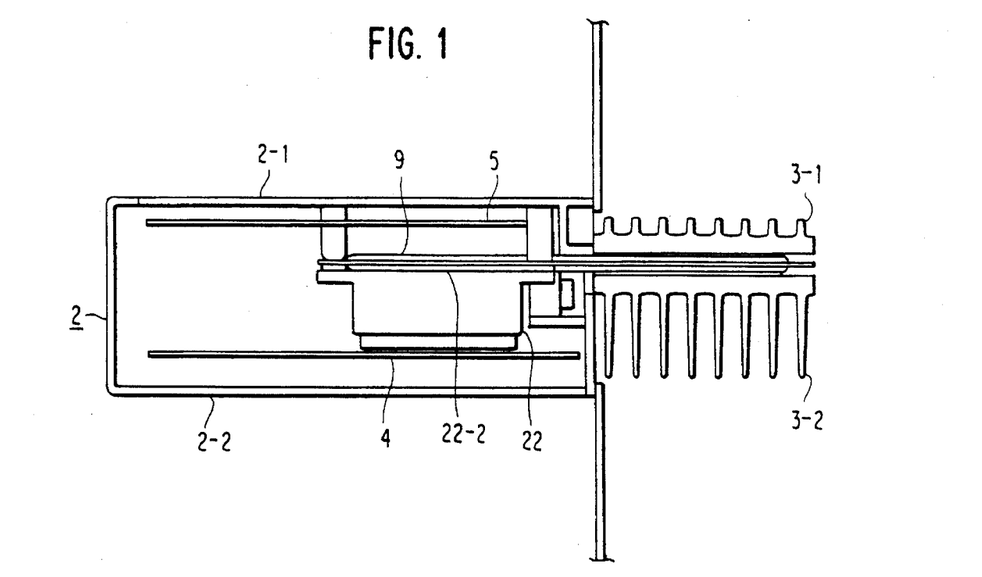
FIG. 1 is a top sectional view of a motor control unit, showing an embodiment of the present invention.
Figure 2A:
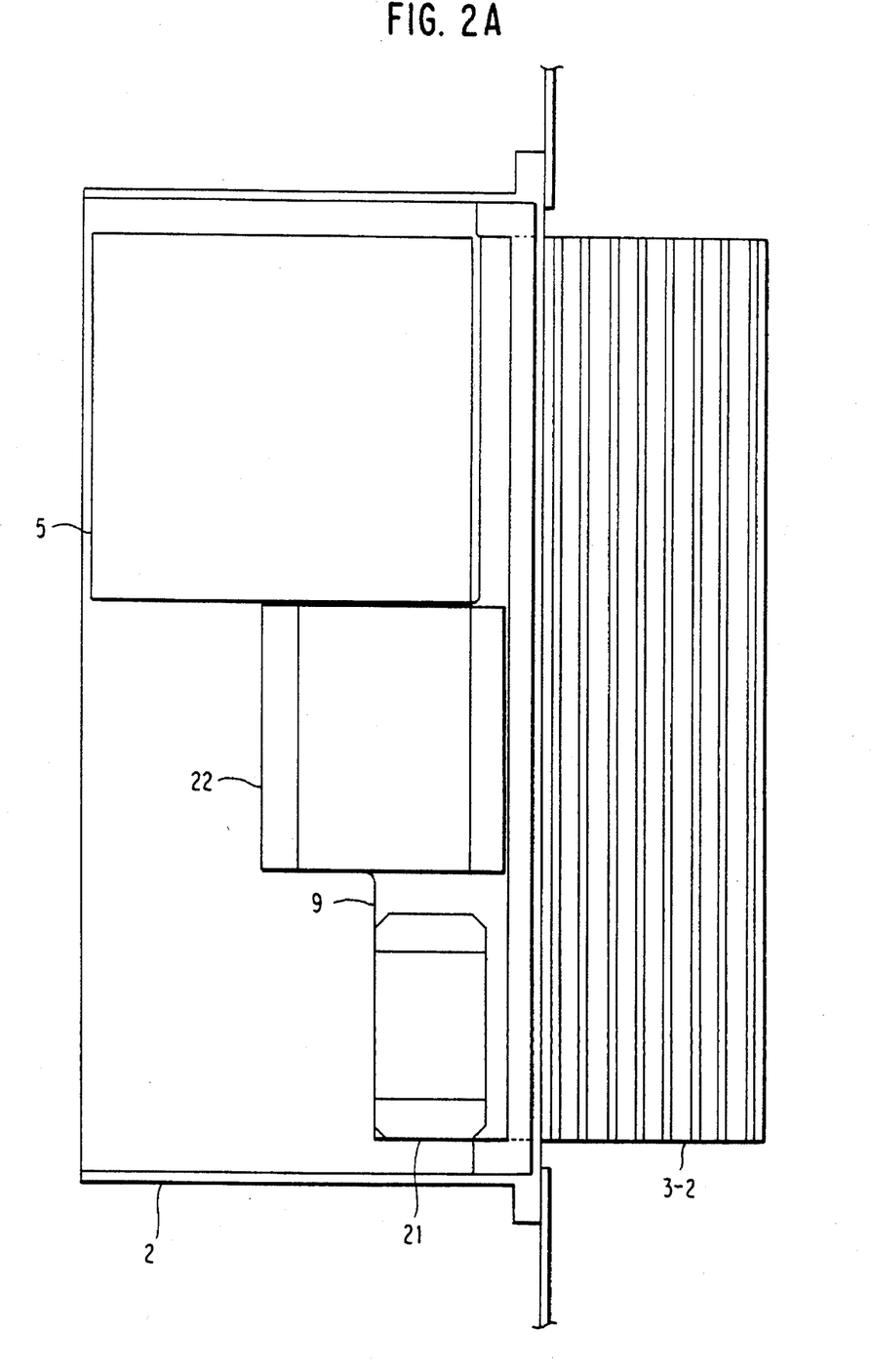
FIG. 2A is a side view showing the motor control unit from which a unit case and printed circuit boards have been removed.
Figure 2B:
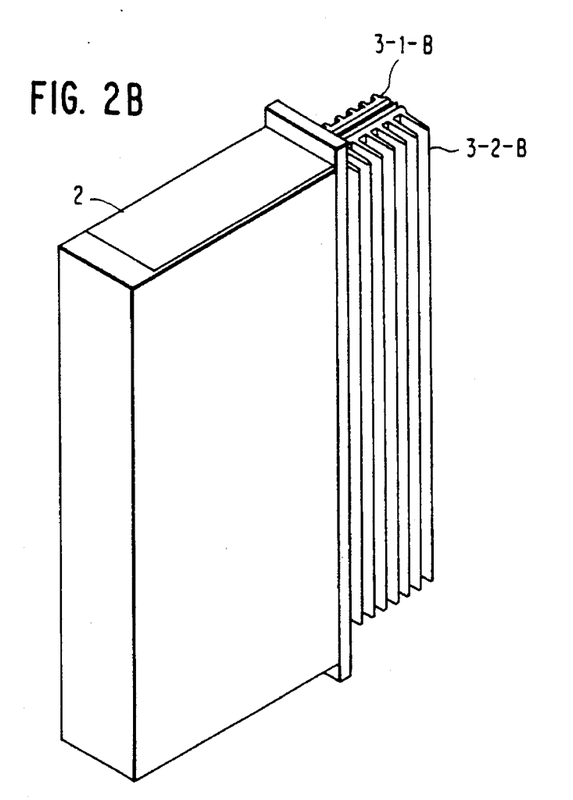
FIG. 2B is a perspective or "birds-eye" view of the motor control unit embodying the invention.

FIG. 1 is a top sectional view of a motor control unit 8 showing an embodiment of the present invention. FIG. 2A is a side view thereof from which a unit case and printed circuit boards have been removed and FIG. 2B is a perspective or "birds-eye" view of the exterior of the unit case. In these drawings, like reference characters designate like or corresponding parts throughout the several views.

A rectangular unit case 2, consisting of base 2-1 for mounting electronic elements and a removable cover 2-2, is set vertically long and laterally short when the motor control unit is installed to a mounting surface 30 of a control box or the like. A main circuit printed circuit board 4 and a control circuit printed circuit board 5 are arranged in parallel with the right- and left-hand side walls of the unit case 2 and are mounted and electrically connected with main circuit components, such as modules 21 and 22, and control circuit components, such as an operation circuit 13 and PWM generator circuit 11. A hollow laminar heat plate 9 is arranged in parallel with the right- and left-hand side walls of the unit case 2, one part of which is within the unit case and the other part extends to an area outside the unit case. The heat plate inside the unit case is in contact with heat radiating installation surfaces 21-2 and 22-2 of the modules 21 and 22, respectively, which generate a substantial amount of heat. The heat plate outside the unit case is in contact with connections 3-1A and 3-2A of heat sinks 3-1 and 3-2. The fins 3-1B and 3-2B of the heat sinks 3-1 and 3-2 are arranged so that air flows in the vertical direction of the motor control unit 8.

Figure 3A:
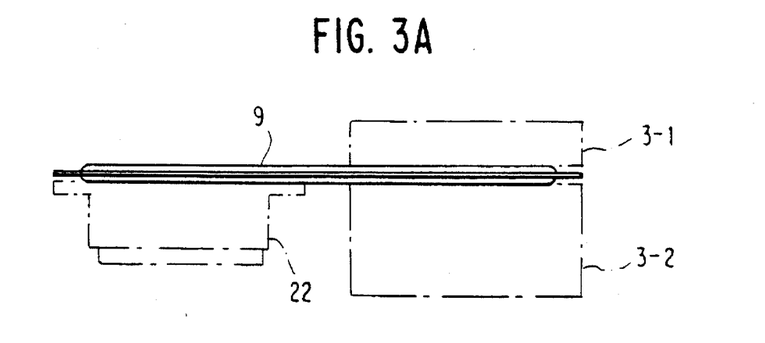
FIGS. 3A and 3B shows relationships between a heat plate, main circuit components and heat sinks employed in the present invention.
Figure 3B:
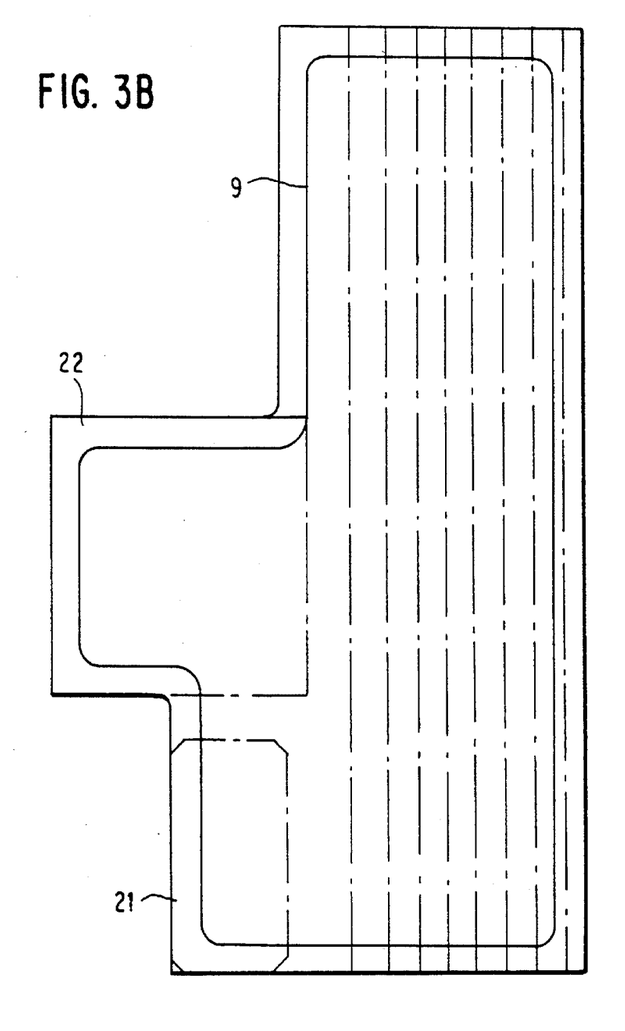

The heat plate 9 consists of two copper or aluminum plates, as shown in FIGS. 3A and 3B, and its expanded center area is hollow and is filled with hydraulic fluid such as ammonia. When the motor control unit operates, the modules generate heat, which is transferred from the heat radiating installation surfaces of the modules via the heat plate, raising the temperature of the hydraulic fluid in the heat plate 9. When this temperature reaches or rises above the vaporization temperature of the hydraulic fluid, the hydraulic fluid is vaporized and takes away latent heat when vaporized. Due to a pressure difference, the vapor of the vaporized hydraulic fluid moves toward the outside of the unit case where temperature and pressure are lower than in the inside, transfers its own heat to the heat sinks 3-1 and 3-2 via the sheet 2 of the heat plate, and is thereby cooled, condensed and liquefied. The liquefied hydraulic fluid flows back to the module 21, 22 side in the unit case 2. Since the heat plate is extremely small in longitudinal heat resistance as is known, a heat radiating characteristic achieved is identical to that obtained when the modules and heat sinks are in direct contact. As shown in FIGS. 3A and 3B, the heat plate 9 is designed to be of a size almost entirely contacting the connections 3-1A and 3-2A of the heat sinks 3-1 and 3-2. Hence, the heat generated by the modules can be diffused to almost the entire surfaces of the heat sinks 3-1 and 3-2, rendering the temperature of the heat sinks 3-1 and 3-2 almost uniform. In addition, the heat sinks provided on both surfaces of the heat plate 9 reduce the fin height of the heat sinks. Further, they ensure that there is little temperature difference between the heat sinks and ensure efficient heat dissipation.

It will be apparent that in addition to the diode and transistor modules described as the main circuit components generating much heat in the present embodiment, any other parts generating much heat, e.g., regenerative parts, are brought into contact with the heat plate.

Although this invention has been described in at least one preferred form with a certain degree of particularity, it is to be understood that the present disclosure of the preferred embodiment has been made only by way of example and that numerous changes in the details and arrangement of components may be made without departing from the spirit and scope of the invention as hereinafter claimed.

What is claimed is:

1. A motor control unit comprising a first semiconductor module circuit for converting an alternating current into a direct current, a second semiconductor module circuit consisting of switching elements for converting said direct current into an alternating current of optional voltage and frequency, a control circuit for controlling the semiconductor module circuits, a unit case accommodating said circuits and being substantially rectangular in cross section, vertically high and laterally thin with respect to a perpendicular installation surface and comprising front, right-side, left-side and back surfaces, and a plurality of heat sinks disposed outside said unit case at the back thereof, at least one printed circuit board mounted with said semiconductor modules and a hollow, laminar heat plate which is filled with a hydraulic fluid, said at least one board and said plate being disposed in parallel with the right- and left-side walls of said unit case, one part of said heat plate being disposed inside said unit case and the other part thereof extending to the outside of said unit case, and the heat dissipating installation surfaces of semiconductor modules being in contact with said heat plate inside said unit case and said heat sinks being in contact with said heat plate outside said unit case, thereby transferring and dissipating heat generated inside the unit case to the heat sinks outside said unit case, wherein said plurality of heat sinks comprise two heat sink structures disposed on opposite sides of said heat plate, each of said heat sink structures including a substantially flat plate base and a plurality of fins extending from said substantially flat plate base, wherein substantially the entire surface area of the other part of said heat plate is in contact with said heat sink structures, wherein said plurality of fins extend outwardly away from said heat plate to an extent bounded by a projected area of a laterally thin side of said substantially rectangular unit case, and further wherein said plurality of fins on one side of said heat plate are longer in length than said plurality of fins on the opposite side of said heat plate.

2. A motor control unit comprising at least one heat generating circuit module mounted on at least one printed circuit board and a unit case accommodating said circuit board and being adapted for installation in a vertical surface, the improvement comprising:

said unit case being substantially rectangular in cross section, vertically high and laterally thin with respect to a perpendicular installation surface and comprising front, right-side, left-side and back surfaces;

a plurality of heat sinks disposed outside said unit case at the back thereof;

a hollow, laminar heat plate which is filled with a hydraulic fluid;

wherein said at least one board and said heat plate are disposed in parallel with the right- and left-side surfaces of said unit case, one part of said heat plate being disposed inside said unit case and the other part thereof extending to the outside of said unit case, and the heat dissipating installation surfaces of said semiconductor modules being in contact with said heat plate inside said unit case and said plurality of heat sinks being in contact with said heat plate outside said unit case, thereby transferring and dissipating heat generated inside the unit case to said heat sinks outside said unit case, wherein said plurality of heat sinks comprise two heat sink structures disposed on opposite sides of said heat plate, each of said heat sink structures including a substantially flat plate base and a plurality of fins extending from said substantially flat plate base, wherein substantially the entire surface area of the other part of said heat plate is in contact with said heat sink structures, wherein said plurality of fins extend outwardly away from said heat plate to an extent bounded by a projected area of a laterally thin side of said substantially rectangular unit case, and further wherein said plurality of fins on one side of said heat plate are longer in length than said plurality of fins on the opposite side of said heat plate.

* * * * *